(12) United States Patent
Nakano et al.

(10) Patent No.: US 8,809,894 B2
(45) Date of Patent: Aug. 19, 2014

(54) SEMICONDUCTOR LIGHT EMITTING DIODE AND METHOD OF PRODUCING THE SAME

(75) Inventors: Masayuki Nakano, Tokyo (JP); Hiroyuki Togawa, Tokyo (JP); Hidetaka Yamada, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 139 days.

(21) Appl. No.: 13/148,816

(22) PCT Filed: Feb. 8, 2010

(86) PCT No.: PCT/JP2010/000738
§ 371 (c)(1),
(2), (4) Date: Aug. 10, 2011

(87) PCT Pub. No.: WO2010/092783
PCT Pub. Date: Aug. 19, 2010

(65) Prior Publication Data
US 2012/0007116 A1 Jan. 12, 2012

(30) Foreign Application Priority Data
Feb. 10, 2009 (JP) ................. 2009-028505

(51) Int. Cl.
*H01L 33/38* (2010.01)
*H01L 33/30* (2010.01)
*H01L 33/46* (2010.01)
*H01L 33/40* (2010.01)
*H01L 33/00* (2010.01)

(52) U.S. Cl.
CPC ............. *H01L 33/387* (2013.01); *H01L 33/46* (2013.01); *H01L 33/405* (2013.01); *H01L 33/0079* (2013.01)
USPC .................. 257/99; 257/98; 257/103; 438/22; 438/29

(58) Field of Classification Search
None
See application file for complete search history.

(56) References Cited

U.S. PATENT DOCUMENTS 7,829,911 B2 11/2010 Unno
2007/0145405 A1* 6/2007 Yamada et al. ............... 257/103
(Continued)

FOREIGN PATENT DOCUMENTS

CN 101295760 A 10/2008
DE 10 2007 020 291 A1 8/2008
(Continued)

OTHER PUBLICATIONS

International Search Report issued in Application No. PCT/JP2010/000738; Dated Apr. 27, 2010 (With Translation).
(Continued)

Primary Examiner — Johannes P Mondt
(74) Attorney, Agent, or Firm — Oliff PLC

(57) ABSTRACT

A semiconductor light emitting diode including: a support substrate; an intermediate layer including an intermediate electrode portion, a second conductive semiconductor layer, an active layer, a first conductive semiconductor layer and an upper electrode portion sequentially disposed on the upper surface side of the support substrate in this order; and a lower electrode layer provided on the lower surface side of the support substrate, where: the intermediate layer has at least one intermediate electrode portion extending linearly or in an island-like shape; and the upper electrode portion and the intermediate electrode portion are disposed in such a positional relationship that these electrode portions are in parallel with and offset from each other and a distance between the upper electrode portion and the intermediate electrode portion is within the range of 10 μm to 50 μm.

4 Claims, 2 Drawing Sheets

(56) References Cited

U.S. PATENT DOCUMENTS

| | | | |
|---|---|---|---|
| 2008/0173885 A1* | 7/2008 | Kuromizu | 257/98 |
| 2008/0224164 A1* | 9/2008 | Huang et al. | 257/98 |
| 2008/0230791 A1* | 9/2008 | Lin et al. | 257/91 |
| 2008/0265267 A1 | 10/2008 | Unno | |
| 2009/0008668 A1 | 1/2009 | Matsumura | |
| 2009/0127578 A1 | 5/2009 | Masuya | |

FOREIGN PATENT DOCUMENTS

| | | |
|---|---|---|
| EP | 1 592 072 A2 | 11/2005 |
| JP | A-03-003373 | 1/1991 |
| JP | A-2004-172217 | 6/2004 |
| JP | A-2007-221029 | 8/2007 |
| JP | A-2007-258326 | 10/2007 |
| JP | A-2008-263105 | 10/2008 |
| WO | WO 2007/036164 A1 | 4/2007 |

OTHER PUBLICATIONS

Office Action issued in Chinese Application No. 201080016159.2 dated May 13, 2013 (with translation).
Notification of Reasons for Refusal dated Mar. 2, 2010 in Japanese Patent Application No. 2009-028505 (with translation).
Decision of Rejection dated Aug. 24, 2010 in Japanese Patent Application No. 2009-028505 (with translation).
Dec. 9, 2013 Extended Search Report issued in European Patent Application No. 10741063.1-1564/2398078.
Apr. 10, 2014 Office Action issued in Chinese Patent Application No. 201080016160.5 (with English Translation).
May 22, 2014 Office Action issued in U.S. Appl. No. 13/148,777.

\* cited by examiner

SEMICONDUCTOR LIGHT EMITTING DIODE AND METHOD OF PRODUCING THE SAME

TECHNICAL FIELD

The present invention relates to a semiconductor light emitting diode and a method of producing the same and, more specifically to a semiconductor light emitting diode with improved light output power and a method of producing the same.

PRIOR ART

In recent years, as applications of an LED (semiconductor light emitting diode) are diversified, there has been a demand for an LED having higher light output power.

In general, an LED has a configuration in which a semiconductor stack including, for example, an n-type semiconductor layer, an active layer, and a p-type semiconductor layer, is sandwiched between a pair of electrodes. When a voltage is applied to such an LED, light is generated in the active layer, and the light travels isotropically in all directions. It is known that a portion of such light traveling toward an electrode portion on the light extraction side is absorbed and/or reflected by the electrode portion without being emitted outside the LED, significantly affecting the light extraction efficiency.

In particular, thin-film semiconductor layers laminated by MOCVD or the like has a problem in that most of the light generated in an active layer immediately under an electrode portion on the light extraction side is absorbed and/or reflected by the electrode portion, which significantly decreases light extraction efficiency.

In order to solve such a problem as described above, JP-A 03-003373 discloses a technique of appropriately providing an electrode portion on the light extraction side with an intermediate energy gap layer made of an InGaP material in order to expand a light emitting region to parts of the active layer other than the part thereof immediately under the electrode portion, thereby improving the light extraction efficiency.

Further, JP-A 2007-221029 discloses a technique of forming a contact portion only in a part other than the part immediately under the electrode portion on the light extraction side to improve internal quantum efficiency by current confinement and also improve light extraction efficiency of the generated light.

It is generally considered that the farther a light emitting region of an active layer is distanced away from the position immediately under one electrode portion on the light extraction side, the less effect is caused by light blockage by the electrode portion on the light extraction side. On this basis, it has been conventionally practiced to improve the light extraction efficiency of LED by increasing the distance between the position immediately under the one electrode portion on the light extraction side and the other electrode portion paired with the one electrode portion.

However, simply increasing the aforementioned distance causes a problem in that the distance between the one electrode portion on the light extraction side and the other electrode portion paired therewith increases accordingly, which inevitably increases resistance when an electric current flows between these electrodes. However, the prior art has never paid any attention to an increase in forward voltage caused by this increase in resistance. Further, the prior art has never paid any attention to the relationship between light output power and a distance between the position immediately under the one electrode portion on the light extraction side and the other electrode portion paired therewith.

DISCLOSURE OF THE INVENTION

Problems to be Solved by the Invention

An object of the present invention is to provide a semiconductor light emitting diode in which light output power is improved, while a relatively low forward voltage is maintained, by positioning an upper electrode portion as an electrode portion on the light extraction side and an intermediate electrode portion(s) paired with the upper electrode portion in an appropriate positional relationship, and a method of producing the same.

Means for Solving the Problem

To achieve the aforementioned object, the present invention primarily includes the following components.
(1) A semiconductor light emitting diode comprising: a support substrate; an intermediate layer including an intermediate electrode portion, a second conductive semiconductor layer, an active layer, a first conductive semiconductor layer and an upper electrode portion sequentially disposed on the upper surface side of the support substrate in this order; and a lower electrode layer provided on the lower surface side of the support substrate, wherein: the intermediate layer has at least one linearly extending intermediate electrode portion; and the upper electrode portion and the intermediate electrode portion are disposed in such a positional relationship that these electrode portions are in parallel with and offset from each other and a distance between the upper electrode portion and the intermediate electrode portion is within the range of 10 µm to 50 µm in a view obtained by projecting these electrode portions on an imaginary plane in parallel with the upper surface of the support substrate, respectively.
(2) The semiconductor light emitting diode described in (1) above, wherein a metal layer as a reflective layer is further provided between the support substrate and the intermediate layer.
(3) A method of producing a semiconductor light emitting diode, comprising the steps of: forming a first conductive semiconductor layer, an active layer, and a second conductive semiconductor layer in this on a growth substrate; forming an intermediate layer including an intermediate electrode portion on the second conductive semiconductor layer; bonding a support substrate onto the intermediate layer; exposing the first conductive semiconductor layer by removing the growth substrate; and forming an upper electrode portion on the exposed first conductive semiconductor layer, wherein the upper electrode portion and the intermediate electrode portion are disposed in such a positional relationship that these electrode portions are in parallel with and offset from each other and a distance between the upper electrode portion and the intermediate electrode portion is within the range of 10 µm to 50 µm in a view obtained by projecting these electrode portions on an imaginary plane in parallel with the upper surface of the support substrate, respectively.
(4) The method of producing a semiconductor light emitting diode described in (3) above further comprising the step of forming a metal layer as a reflective layer on the intermediate layer.

Effect of the Invention

In the semiconductor light emitting diode of the present invention, the upper electrode portion and the intermediate electrode portion are disposed in such a positional relationship that these electrode portions are in parallel with and offset from each other and the distance between an upper electrode portion and an intermediate electrode portion is optimized in a view obtained by projecting these electrode portions on an imaginary plane in parallel with the upper surface of the support substrate, respectively, whereby light output power can be improved while relatively low forward voltage is maintained.

According to the method of producing a semiconductor light emitting diode, it is possible to produce a semiconductor light emitting diode capable of improving light output power while maintaining relatively low forward voltage by, in a view obtained by projecting the upper electrode portion and the intermediate electrode portion on an imaginary plane in parallel with the upper surface of the support substrate, respectively, disposing the upper electrode portion and the intermediate electrode portion in such a positional relationship that these electrode portions are in parallel with and offset from each other and optimizing the distance between these electrode portions.

BEST MODE FOR CARRYING OUT THE INVENTION

Figure 1A:
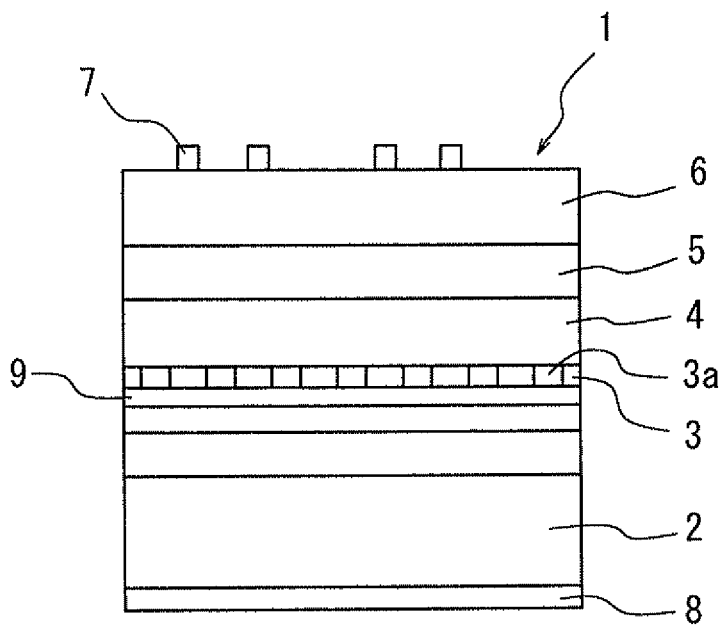
FIGS. 1A and 1B are schematic views each illustrating a semiconductor light emitting diode according to the present invention.

Next, an embodiment of a semiconductor light emitting diode of the present invention will be described with reference to the drawings. FIG. 1A is a plan view schematically showing a cross-sectional structure of a semiconductor light emitting diode according to the present invention before being diced, and FIG. 1B is a plan view schematically showing a predetermined chip obtained by dicing of the semiconductor light emitting diode.

As shown in FIG. 1A, a semiconductor light emitting diode 1 of the present invention has: a support substrate 2; an intermediate layer 3 including an intermediate electrode portion 3$a$, a second conductive semiconductor layer 4, an active layer 5, a first conductive semiconductor layer 6 and an upper electrode portion 7 sequentially disposed on the upper surface side of the support substrate in this order; and a lower electrode layer 8 provided on the lower surface side of the support substrate 2. The intermediate layer 3 has at least one intermediate electrode portion 3$a$ extending linearly or in an island shape.

Figure 1B:
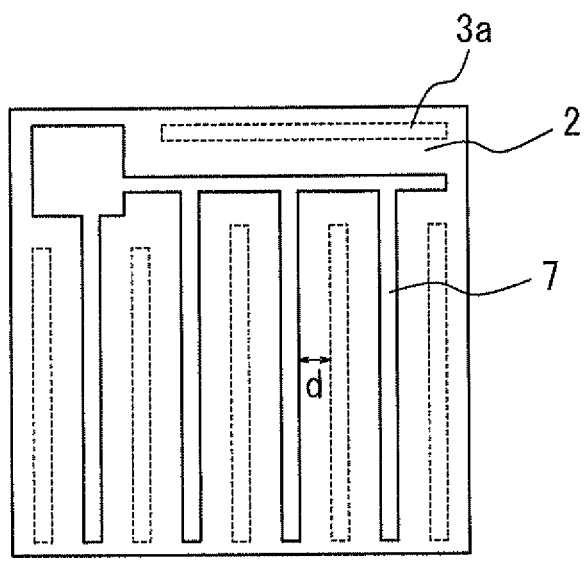

Further, as shown in FIG. 1B, in a view in which the upper electrode portion 7 and the intermediate electrode portion(s) 3$a$ are projected on an imaginary plane in parallel to the upper surface of the support substrate 2, the upper electrode portion 7 and the intermediate electrode portion(s) 3$a$ are in a positional relationship in which these electrode portions are in parallel to and offset from each other (interdigitated) and the distance d between the upper electrode portion 7 and each intermediate electrode portion 3$a$ (hereinafter the distance will be referred to as "inter-electrode distance d") is within the range of 10 µm to 50 µm. By way of example, the intermediate electrode portion(s) 3$a$ are configured to be in an island shape, as shown in FIG. 1B. In addition, the upper electrode portion 7 and the intermediate electrode portion(s) 3$a$ are in a positional relationship such that a comb shape is formed between the upper electrode portion 7 and the intermediate electrode portion(s) 3$a$.

In the present embodiment, the upper electrode portion 7 and the intermediate electrode portion 3$a$ are disposed in such a positional relationship that these electron portions are in parallel to and offset from each other as described above, whereby a light emitting region of the active layer 5 is offset with respect to the upper electrode portion 7 and thus the light extraction efficiency and light output power improve. Further, since the inter-electrode distance d is set within the range of 10 µm to 50 µm, relatively low forward voltage and high light emission output can be achieved in a compatible manner.

In a case where the inter-electrode distance d is less than 10 µm, an electric current component flowing immediately under the upper electrode portion 7 increases, whereby an effect of offsetting the intermediate electrode portion 3$a$ and the upper electrode part 7 from each other cannot be obtained in a satisfactory manner. In a case where the inter-electrode distance d exceeds 50 µm, a distance component of electric resistance increases, which makes it impossible to realize low forward voltage.

Examples of materials for the second conductive semiconductor layer 4, the active layer 5, and the first conductive semiconductor layer 6 include an AlGaAs-based material and an AlGaInP-based material. The type of a material for the support substrate 2 can be selected in accordance with these materials for the second conductive semiconductor layer 4, the active layer 5, and the first conductive semiconductor layer 6. The layers 4, 5, and 6 and the support substrate 2 may have a thicknesses of 1 µm to 10 µm, 10 nm to 500 nm (total thickness), 1 µm to 10 µm, and 100 µm to 400 µm, respectively. In a case where the first conductivity type semiconductor layer 6 is a p-type layer, the second conductivity type semiconductor layer 4 is to be an n-type layer, and vice versa.

The upper electrode portion 7 may have a structure including an ohmic contact layer (50 nm to 500 nm) made of an AuGe-based alloy material and a pad layer (1 µm to 3 µm), for wire bonding formed by laminating an Au material on a Ti material. A material for the lower electrode layer 8 may be appropriately selected in accordance with the material of the support substrate 2.

A material of the intermediate electrode portion 3$a$ may be, for example, an AuZn-based alloy material, and part of the intermediate layer 3 other than the intermediate electrode portion 3$a$ can be made of, for example, an insulating material including a $SiO_2$ material or a $Si_3N_4$ material. Since it is desirable that relatively few irregularities exist on the surfaces of wafers at the time of bonding the support substrate 2, the intermediate layer 3 preferably has a thickness equal to that of the insulating material layer, specifically in the range of 50 nm to 500 nm. In a case where the thickness is less than 50 nm, insufficient insulation may be resulted. In a case where the thickness exceeds 500 nm, although the intended effect of the present application can be somehow achieved, influence of light caused by the insulating material may increase to an unignorable level and the effect achieved by thickening the intermediate layer 3 may reach a plateau, which renders further increase in the thickness uneconomical.

Further, it is preferable to further provide a metal layer 9 as a reflective layer between the support substrate 2 and the intermediate layer 3. Light emitted by the active layer 5 and proceeding toward the support substrate 2 can be effectively collected on the side of the upper electrode portion 7 by provision of the metal layer 9. Examples of a material for the metal layer 9 include Au, Al, Cu and a metal material for welding such as a solder material. In a case where the light emitting layer is to emit light having a wavelength corresponding to red to infrared, it is preferable that an Au material exhibiting a relatively high reflectivity with respect to light in the red-infrared wavelength range is used for the metal layer 9 and that the metal layer 9 has a thickness of 100 nm to 1000 nm. In the aforementioned case, if the thickness of the metal layer 9 is less than 100 nm, the light reflectivity may deteriorate. If the thickness of the metal layer 9 exceeds 1000 nm, although the intended effect of the present invention can be somehow achieved, the production cost may unnecessarily increase without enhancing light reflectivity, which is uneconomical.

Next, an embodiment of a method of producing the semiconductor light emitting diode according to the present invention will be described with respect to the drawings. FIGS. 2A to 2H schematically illustrate a method of producing a semiconductor light emitting diodes according to the present invention.

Figure 2A:
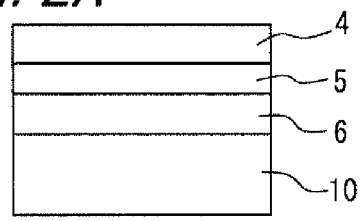
FIGS. 2A to 2H are schematic views illustrating a method of producing a semiconductor light emitting diode according to the present invention.

As shown in FIG. 2A, in the method of producing the semiconductor light emitting diode 1 of the present invention, the first conductive semiconductor layer 6, the active layer 5, and the second conductive semiconductor layer 4 are sequentially formed in this order on a growth substrate 10. These layers 6, 5, and 4 can be formed, for example, by epitaxial growth using MOCVD. The growth substrate 10 can be constituted as, for example, a GaAs substrate and thickness thereof, although it is not limited in particular, may be in the range of 200 μm to 400 μm.

Figure 2B:
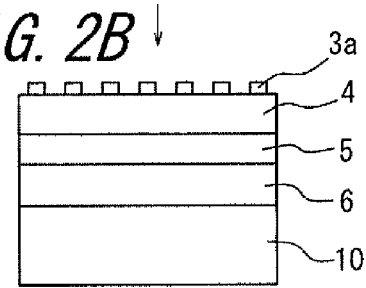
Figure 2C:
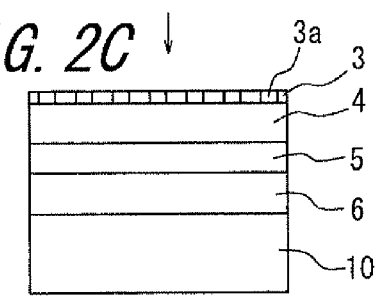

Next, as shown in FIG. 2B and FIG. 2C, the intermediate layer 3 including the intermediate electrode portion 3a is formed on the second conductive semiconductor layer 4. The intermediate electrode portion 3a is deposited on the second conductive semiconductor layer 4, for example, by sputtering, electron beam vapor-deposition, resistance heating vapor-deposition, and then etched into a predetermined shape as shown in FIG. 2B. Subsequently, the laminate is subjected to a predetermined heat treatment to reduce the contact resistance between the intermediate electrode portion 3a and the second conductive semiconductor layer 4. An insulating film is then formed on the intermediate electrode portion 3a and the second conductive semiconductor layer 4, e.g. by sputtering or plasma CVD, and portions of the insulating film exceeding the height of the intermediate electrode portion 3a is removed, e.g. by wet etching or dry etching, to form the intermediate layer 3 as shown in FIG. 2C.

Figure 2D:
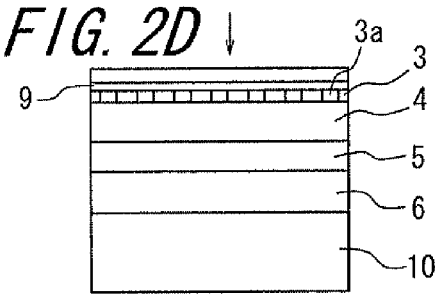
Figure 2E:
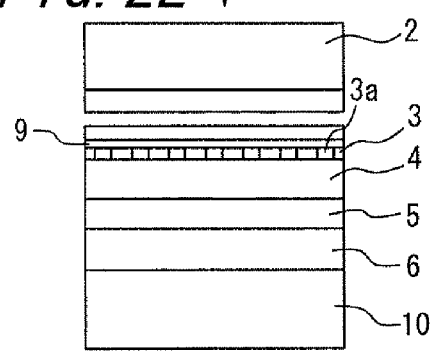

Next, as shown in FIG. 2D and FIG. 2E, the support substrate 2 is bonded onto the intermediate layer 3. It is preferable that the metal layer 9 as a reflective layer is formed on the intermediate layer 3 prior to this bonding process. The metal layer 9 may be formed by vapor-depositing, for example, Au, Al, or Cu, or a metal material welding such as a solder material on the intermediate layer 3. An Au material is preferable because the material allows bonding at a relatively low temperature and is less likely to be oxidized or corroded. A diffusion barrier layer (50 nm to 200 nm) made of, for example, a Pt material and a bonding layer (1 μm to 2 μm) made of, for example, an Au material may further be formed on the metal layer 9 prior to the bonding process. On the other hand, an ohmic contact layer (50 nm to 500 nm) made of e.g. an AuGe-based alloy material, an adhesion layer (50 nm to 200 nm) made of e.g. a Ti material, and a bonding layer (1 μm to 2 μm) made of e.g. an Au material, are preferably formed on the support substrate 2 prior to the bonding process. Bonding of the support substrate 2 onto the intermediate layer 3 is preferably performed by thermal pressure bonding, for example, at a temperature in the range of 250° C. to 400° C. for 15 to 120 minutes. Bonding wafers by way of the metal layer allows substrate bonding at a relatively low temperature, which enables bonding without deteriorating the characteristics or the structure of the semiconductor layer.

Figure 2F:
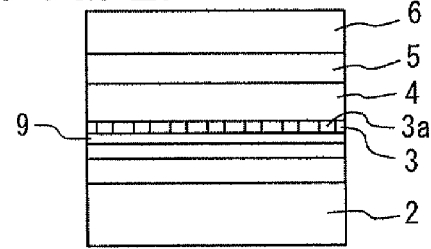

Thereafter, as shown in FIG. 2F, the growth substrate 10 is removed to expose the first conductive semiconductor layer 6. The growth substrate 10 may be removed by, for example, abrasion or wet etching. The etching solution can be selected depending on the material of the growth substrate 10.

Figure 2G:
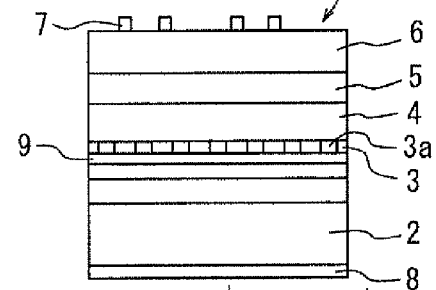

As shown in FIG. 2G, the upper electrode portion 7 is formed on the exposed first conductive semiconductor layer 6. The upper electrode portion 7 may be formed, for example, by vapor-depositing a pad layer on the ohmic contact layer and subjecting the pad layer to wet etching after photolithography such that the upper electrode portion 7 and the intermediate electrode portion 3a are in a positional relationship in which these electrode portions 7, 3a are in parallel to and offset from each other (interdigitated) and the inter-electrode distance d between the upper electrode portion 7 and the intermediate electrode portion 3a is within the range of 10 μm to 50 μm, in a view obtained by projecting the electrode portions 7, 3a on the upper surface of the support substrate 2 from the side above the upper electrode portion 7, as shown in FIG. 1B.

After that, the resulting laminate is subjected to a predetermined heat treatment so that the contact resistance between the upper electrode portion and the first conductive semiconductor layer 6 is reduced.

Figure 2H:
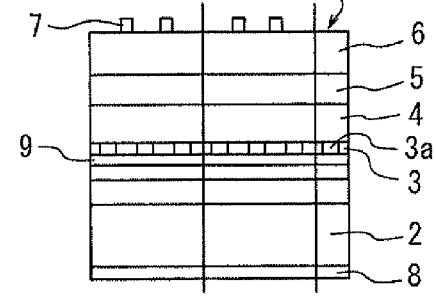

Further, the lower electrode layer 8 is formed by vapor-deposition on the lower side surface of the support substrate 2, and dicing is performed as shown in FIG. 2H.

The semiconductor light emitting diode according to the present invention can be produced using such a method as described above.

The foregoing descriptions merely illustrate one example of embodiments of the present invention and various modifications can be made thereto in the accompanying claims.

EXAMPLE

Next, samples of the current-confined light emitting diode of the present invention are prepared and performances thereof are evaluated. Details will be described below. Samples of Examples are each prepared by sequentially forming, on a growth substrate made of a GaAs material (thickness: 280 μm) and having a cross-sectional structure as shown in FIG. 1A, an n-type semiconductor layer made of an $Al_{0.4}Ga_{0.6}As$ material (thickness: 5 μm, dopant: Te, concentration: $5\times10^{17}/cm^3$), an active layer having an InGaAs/AlGaAs multiple quantum-well structure (thicknesses: 8 nm/5 nm, 3 sets, total thickness: approximately 50 nm), and a p-type semiconductor layer made of an AlGaAs material (thickness: 2 μm, dopant: C, concentration: $1\times10^{18}/cm^3$) in this order by single epitaxial growth by MOCVD for each layer; vapor-depositing thereon an intermediate electrode portion material made of an AuZn alloy (Zn content: 5% by mass) by resistance heating vapor-deposition; subjecting the laminate to a predetermined photolithography process and etching subsequent thereto, to form an intermediate electrode portion (thickness: 100 nm); and subjecting the resulting laminate to a heat treatment at 400° C. to decrease contact resistance between the intermediate electrode portion and the p-type semiconductor layer.

Next, a $Si_3N_4$ material is deposited by plasma CVD on the intermediate electrode portion and the p-type semiconductor layer, and portions of the $Si_3N_4$ material exceeding the height of the intermediate electrode portion is removed by wet etching using a BHF etching solution to form an intermediate layer.

A metal layer (thickness: 500 nm) made of an Au material is formed as a reflective layer on the intermediate layer by electron beam vapor-deposition. A diffusion barrier layer (thickness: 100 nm) made of a Pt material and a bonding layer (thickness: 1 μm) made of an Au material are formed on the metal layer. Further, a support substrate made of a GaAs material (thickness: 280 μm, dopant: Si, concentration: $2 \times 10^{18}/cm^3$) is prepared for bonding. An ohmic contact layer (thickness: 200 nm) made of an AuGe-based alloy (Ge content: 12% by mass) material, an adhesion layer (thickness: 100 nm) made of a Ti material, and a bonding layer (thickness: 1 μm) made of an Au material are formed on the support substrate prior to the bonding process. The bonding layer of the intermediate layer and the bonding layer of the support substrate are subjected to thermal pressure bonding at 350° C. for 30 minutes to bond the support substrate onto the intermediate layer. The structure thus obtained is agitated in a liquid containing aqueous ammonia, hydrogen peroxide solution and water in ratios of 1:12:18 (volume ratio) for two hours at room temperature to carry out wet etching to remove the growth substrate.

Next, an ohmic contact layer (thickness: 200 nm) made of an AuGe-based alloy (Ge content: 12% by mass) material and a pad layer obtained by laminating a Ti material on an Au material (Ti thickness: 100 nm, Au thickness: 2 μm) are vapor-deposited on the exposed n-type semiconductor layer by resistance heating vapor-deposition. The resulting laminate is then subjected to photolithography and wet etching subsequent thereto such that the upper electrode portion and the intermediate electrode portion are in such a positional relationship as shown in FIG. 1B and the inter-electrode distance is the corresponding value shown in Table 1 in a view in which these electrode portions are projected on the upper surface of the support substrate from the side above the upper electrode portion. The resulting laminate is then subjected to a heat treatment at 380° C. In the structure shown in FIG. 1B, the upper electrode portions each having 20 μm width extend from a pad portion (100 μm×100 μm) for wire bonding formed at a corner of a chip. The number of the upper electrode portions and the number of the intermediate electrodes are appropriately selected in accordance with the inter-electrode distance.

Finally, a mesa is formed by etching the resulting product using a mixed solution of phosphoric acid and a hydrogen peroxide solution, and then square (500 μm×500 μm) chips are produced by dicing the mesa by dicing using a dicer.

The chips thus produced were set in an integrating sphere to measure forward voltage Vf (V) and light output power Po (mW) upon passing electric current of 20 mA thereto. The result is shown in Table 1. Light output power was measured using a total spectral flux measurement system ("SLMS-1021-S", manufactured by Labsphere Co., Ltd.)

TABLE 1

| | Inter-electrode Distance d (μm) | Light Output Power Po (mW) | Forward Voltage Vf (V) |
|---|---|---|---|
| Example 1 | 10 | 4.9 | 1.44 |
| Example 2 | 30 | 5.1 | 1.44 |
| Example 3 | 35 | 5.2 | 1.45 |
| Example 4 | 50 | 5.7 | 1.55 |
| Comparable Example 1 | 0 | 2.8 | 1.43 |
| Comparable Example 2 | 5 | 3.8 | 1.43 |
| Comparable Example 3 | 60 | 5.8 | 1.58 |

It is understood from the results shown in Table 1 that Examples 1 to 4 can improve light output power, while maintaining relatively low forward voltage, as compared with Comparative Examples 1 to 3.

In particular, the results show a clear correlation between the inter-electrode distance d and the forward voltage. The Vf value is 1.55 or less in the range of $10 \leq d(\mu m) \leq 50$, which Vf value is low enough for use in LEDs.

Regarding the light output power, the Po value is 4.9 mW or higher in the range of $10 \leq d(\mu m) \leq 50$, which Po value is high enough for use in LEDs.

INDUSTRIAL APPLICABILITY

According to the present invention, it is possible to produce a semiconductor light emitting diode capable of improving light output power with maintaining satisfactory low forward voltage by disposing an upper electrode portion and an intermediate electrode portion in a positional relationship in which these electrode portions are in parallel to and offset from each other and optimizing a distance between the upper electrode portion and the intermediate electrode portion in a view obtained by projecting the upper electrode portion and the intermediate electrode portion on an imaginary plane in parallel to the upper surface of the support substrate.

According to the method of producing a semiconductor light emitting diode of the present invention, it is possible to produce a semiconductor light emitting diode capable of improving light output power with maintaining satisfactory low forward voltage by disposing an upper electrode portion and an intermediate electrode portion in a positional relationship in which these electrode portions are in parallel to and offset from each other and optimizing a distance between the upper electrode portion and the intermediate electrode portion in a view obtained by projecting the upper electrode portion and the intermediate electrode portion on an imaginary plane in parallel to the upper surface of the support substrate.

EXPLANATION OF NUMERAL REFERENCES

1: Semiconductor light emitting diode
2: Support substrate
3: Intermediate layer
3a: Intermediate electrode portion
4: Second conductive semiconductor
5: Active layer
6: First conductive semiconductor
7: Upper electrode portion
8: Lower electrode layer
9: Metal layer
10: Growth substrate

The invention claimed is:
1. A semiconductor light emitting diode comprising:
a support substrate;
an intermediate layer including an intermediate electrode portion, a second conductive semiconductor layer, an active layer, a first conductive semiconductor layer and an upper electrode portion sequentially disposed on an upper surface side of the support substrate in this order; and a lower electrode layer provided on a lower surface side of the support substrate, wherein:

the second conductive semiconductor layer, the active layer, and the first conductive semiconductor layer consist of an AlGaAs-based material or an AlGaInP-based material, and have a thickness of 1 μm to 10 μm, 10 nm to 500 nm, and 1 μm to 10 μm, respectively:

the intermediate layer has at least one intermediate electrode portion extending linearly and in an island shape, the upper electrode portion is in a comb shape, and the upper electrode portion and the intermediate electrode portion are disposed in such a positional relationship that these electrode portions are in parallel with and offset from each other and a distance between the upper electrode portion and the intermediate electrode portion is within the range of 10 μm to 50 μm in a view obtained by projecting these electrode portions on an imaginary plane in parallel with the upper surface of the support substrate, respectively.

2. The semiconductor light emitting diode described in claim 1, wherein a metal layer as a reflective layer is further provided between the support substrate and the intermediate layer.

3. A method of producing a semiconductor light emitting diode, comprising the steps of:

forming a first conductive semiconductor layer, an active layer, and a second conductive semiconductor layer consisting of an AlGaAs-based material or an AlGaInP-based material, and having a thickness of 1 μm to 10 μm, 10 nm to 500 nm, and 1 μM to 10 μm, respectively, in this order on a growth substrate;

forming an intermediate layer including at least one intermediate electrode portion extending linearly and in an island shape on the second conductive semiconductor layer;

bonding a support substrate onto the intermediate layer;

exposing the first conductive semiconductor layer by removing the growth substrate; and forming an upper electrode portion on the exposed first conductive semiconductor layer, wherein:

the upper electrode portion is in a comb shape, and the upper electrode portion and the intermediate electrode portion are disposed in such a positional relationship that these electrode portions are in parallel with and offset from each other and a distance between the upper electrode portion and the intermediate electrode portion is within the range of 10 μM to 50 μm in a view obtained by projecting these electrode portions on an imaginary plane in parallel with an upper surface of the support substrate, respectively.

4. The method of producing a semiconductor light emitting diode described in claim 3, further comprising a step of forming a metal layer as a reflective layer on the intermediate layer.

* * * * *